(12) United States Patent
Mori et al.

(10) Patent No.: US 11,859,311 B2
(45) Date of Patent: Jan. 2, 2024

(54) MANUFACTURING METHOD FOR A GROUP-III NITRIDE CRYSTAL THAT REQUIRES A FLOW AMOUNT OF A CARRIER GAS SUPPLIED INTO A RAW MATERIAL CHAMBER AT A TEMPERATURE INCREASE STEP SATISFIES TWO RELATIONAL EQUATIONS (I) AND (II)

(71) Applicant: Panasonic Holdings Corporation, Osaka (JP)

(72) Inventors: Yusuke Mori, Osaka (JP); Masashi Yoshimura, Osaka (JP); Masayuki Imanishi, Osaka (JP); Shigeyoshi Usami, Osaka (JP); Junichi Takino, Osaka (JP); Shunichi Matsuno, Kyoto (JP)

(73) Assignee: PANASONIC HOLDINGS CORPORATION, Osaka (JP)

(*) Notice: Subject to any disclaimer, the term of this patent is extended or adjusted under 35 U.S.C. 154(b) by 0 days.

(21) Appl. No.: 17/846,768

(22) Filed: Jun. 22, 2022

(65) Prior Publication Data

US 2022/0411964 A1     Dec. 29, 2022

(30) Foreign Application Priority Data

Jun. 24, 2021   (JP) ................. 2021-105133

(51) Int. Cl.
*C30B 25/16*    (2006.01)
*C30B 29/40*    (2006.01)
(Continued)

(52) U.S. Cl.
CPC .......... *C30B 29/403* (2013.01); *C30B 23/002* (2013.01); *C30B 23/063* (2013.01); *C30B 25/165* (2013.01)

(58) Field of Classification Search
CPC ....... C30B 23/00; C30B 23/002; C30B 23/06; C30B 23/063; C30B 25/00; C30B 25/02;
(Continued)

(56) References Cited

U.S. PATENT DOCUMENTS

| 2016/0268129 A1 | 9/2016 | Mori et al. |
| 2017/0073840 A1* | 3/2017 | Mori .................. H01L 21/0254 |
| 2020/0017993 A1* | 1/2020 | Mori ...................... C30B 25/02 |

FOREIGN PATENT DOCUMENTS

WO    2015/053341    4/2015

* cited by examiner

*Primary Examiner* — Kenneth A Bratland, Jr.
(74) *Attorney, Agent, or Firm* — Wenderoth, Lind & Ponack, L.L.P.

(57) ABSTRACT

A manufacturing method for a group-III nitride crystal, the manufacturing method includes: preparing a seed substrate; increasing temperature of the seed substrate placed in a nurturing chamber; and supplying a group-III element oxide gas produced in a raw material chamber connected to the nurturing chamber by a connecting pipe and a nitrogen element-containing gas into the nurturing chamber to grow a group-III nitride crystal on the seed substrate, wherein a flow amount y of a carrier gas supplied into the raw material chamber at the temperature increase step satisfies following two relational equations (I) and (II), $y<[1-k*H(Ts)]/[k*H(Ts)-j*H(Tg)]*j*H(Tg)*t$ (I), $y \geq 1.58*10^{-4}*(22.4/28)S*F(N)/F(T)$ (II), wherein k represents an arrival rate to a saturated vapor pressure of a group-III element in the raw material chamber, Ts represents a temperature of the raw material chamber, Tg represents a temperature of the nurturing chamber, H(Ts) represents a saturated vapor pressure of the group-III element at the temperature Ts in the raw material chamber, H(Tg) represents a saturated vapor pressure of the group-III element at the temperature Tg in the nurturing chamber, j represents a corrective coefficient, t (Continued)

represents a sum of gas flow amounts flowing into the nurturing chamber from those other than the raw material chamber, S represents a cross-sectional area of the connecting pipe, F(N) represents a volumetric flow amount of the nitrogen element-containing gas supplied into the nurturing chamber, and F(T) represents a sum of volumetric flow amounts of gases supplied into the nurturing chamber from those other than the raw material chamber.

3 Claims, 3 Drawing Sheets

(51) Int. Cl.
  *C30B 23/00* (2006.01)
  *C30B 23/06* (2006.01)
(58) Field of Classification Search
  CPC ....... C30B 25/10; C30B 25/16; C30B 25/165;
       C30B 29/00; C30B 29/10; C30B 29/40;
       C30B 29/403; C30B 29/406; C23C 16/22;
       C23C 16/30; C23C 16/301; C23C 16/303;
       C23C 16/448; C23C 16/4481; C23C
       16/455; C23C 16/45502
  USPC ... 117/84, 88–89, 91, 93, 99, 102, 105, 937,
       117/952
  See application file for complete search history.

MANUFACTURING METHOD FOR A GROUP-III NITRIDE CRYSTAL THAT REQUIRES A FLOW AMOUNT OF A CARRIER GAS SUPPLIED INTO A RAW MATERIAL CHAMBER AT A TEMPERATURE INCREASE STEP SATISFIES TWO RELATIONAL EQUATIONS (I) AND (II)

CROSS-REFERENCE TO RELATED APPLICATIONS

This application claims a priority of Japanese Patent Application No. 2021-105133 filed on Jun. 24, 2021, the contents of which is incorporated herein by reference.

BACKGROUND

1. Technical Field

The present invention relates to a manufacturing method for a group-III nitride crystal.

2. Description of the Related Art

Group-III nitride crystals of GaN and the like are expected to be applied to the next-generation optical devices such as a high-power light emitting diode (LED) and a laser diode (LD), and to the next-generation electronic devices such as a high-power transistor to be mounted on an electric vehicle (EV), a plug-in hybrid vehicle (PHV), or the like. An oxide vapor phase epitaxy (OVPE) method that uses a group-III element oxide as a raw material is used as a manufacturing method fora group-III nitride crystal (see, e.g., WO 2015/053341A1).

An example of the reaction system in the OVPE method is as follows.
(1) Ga is heated and, in this state, an $H_2O$ gas is introduced. The introduced $H_2O$ gas reacts with Ga to produce a $Ga_2O$ gas (Formula (a) as below).
(2) An $NH_3$ gas is introduced and is reacted with the produced $Ga_2O$ gas to produce a GaN crystal on a seed substrate (Formula (b) as below).

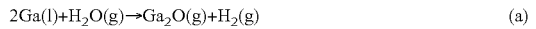
$$2Ga(l)+H_2O(g) \rightarrow Ga_2O(g)+H_2(g) \qquad (a)$$

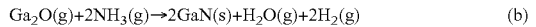
$$Ga_2O(g)+2NH_3(g) \rightarrow 2GaN(s)+H_2O(g)+2H_2(g) \qquad (b)$$

With the manufacturing method described in the above '341A1 publication, the case is however present where, at a step of increasing temperature of the seed substrate, the vapor of a group-III metal (Ga) gas to be the raw material to produce the $Ga_2O$ gas diffuses from a raw material chamber having the raw material placed therein into a nurturing chamber having the seed substrate placed therein. In this case, the seed substrate and the group-III metal gas react with each other and starting points of abnormal growths such as poly-crystals and penetrating pits may be generated on the seed substrate.

On the other hand, to suppress the diffusion of the group-III metal gas, it can be considered to reduce the flow amount of a carrier gas of each of the gas lines, supplied to the raw material chamber that has the group-III metal placed therein. In the case where the flow amount of the carrier gas is reduced, a nitrogen element-containing gas ($NH_3$) supplied to the nurturing chamber however flows backward to the raw material chamber that has the group-III metal placed therein, and reacts with the group-III metal to produce a group-III nitride crystal on the group-III metal. In this case, the group-III metal is covered with the group-III nitride crystal. The group-III element oxide gas ($Ga_2O$) necessary for growth of the crystal thereby tends to avoid being produced even when a reactive gas ($H_2O$) is supplied onto the group-III metal at a growth step after the temperature increase step. It is therefore difficult to efficiently produce a high-quality group-III nitride crystal.

The present invention was conceived in view of the situations, and it is therefore one non-limiting and exemplary embodiment provides a manufacturing method for a group-III nitride crystal having high quality.

SUMMARY

In one general aspect, the techniques disclosed here feature: a manufacturing method for a group-III nitride crystal according to the present disclosure, includes a preparation step of preparing a seed substrate, a temperature increase step of increasing temperature of the seed substrate placed in a nurturing chamber, and a growth step of supplying a group-III element oxide gas produced in a raw material chamber that is connected to the nurturing chamber by a connecting pipe and a nitrogen element-containing gas into the nurturing chamber to grow a group-III nitride crystal on the seed substrate, and a flow amount y of a carrier gas supplied into the raw material chamber at the temperature increase step satisfies the following two relational equations (I) and (II).

$$y < [1-k*H(Ts)]/[k*H(Ts)-j*H(Tg)]*j*H(Tg)*t \qquad (I)$$

$$y \geq 1.58*10^{-4}*(22.4/28)S*F(N)/F(T) \qquad (II)$$

In the above, k represents the arrival rate to the saturated vapor pressure of a group-III element in the raw material chamber, Ts represents the temperature of the raw material chamber, Tg represents the temperature of the nurturing chamber, H(Ts) represents the saturated vapor pressure of the group-III element at the temperature Ts in the raw material chamber, H(Tg) represents the saturated vapor pressure of the group-III element at the temperature Tg in the nurturing chamber, j represents a corrective coefficient, t represents the sum of gas flow amounts flowing into the nurturing chamber from those other than the raw material chamber, S represents the cross-sectional area of the connecting pipe, F(N) represents a volumetric flow amount of the nitrogen element-containing gas supplied into the nurturing chamber, and F(T) represents the sum of volumetric flow amounts of gases supplied into the nurturing chamber from those other than the raw material chamber.

According to the manufacturing method for a group-III nitride crystal of the present disclosure, a high-quality group-III nitride crystal can be manufactured.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF THE DRAWINGS

The present disclosure will become readily understood from the following description of non-limiting and exemplary embodiments thereof made with reference to the accompanying drawings, in which like parts are designated by like reference numeral and in which.

DETAILED DESCRIPTION

Figure 1A:
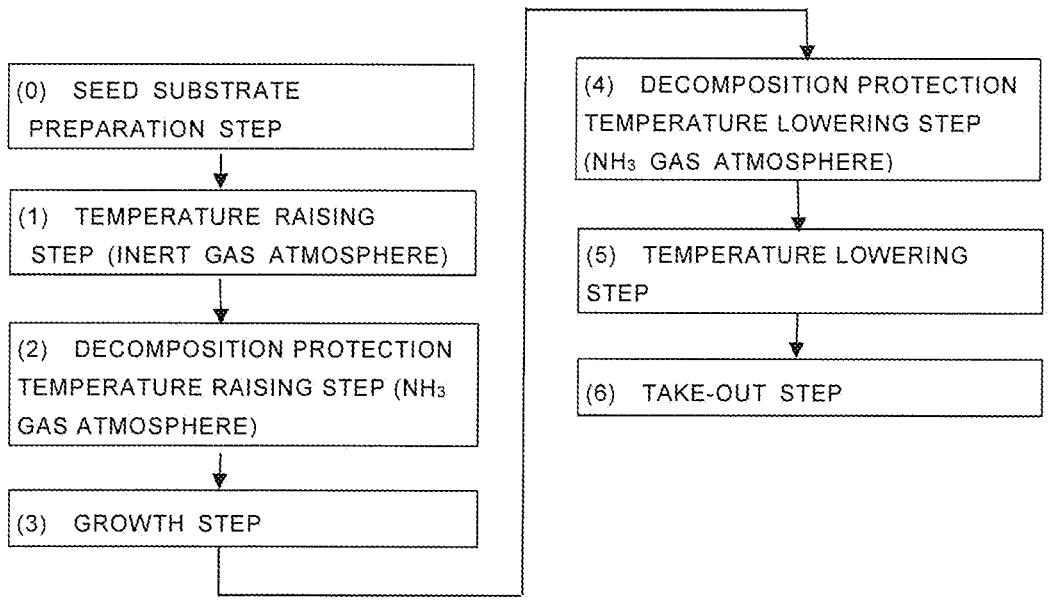
FIG. 1A is a flowchart showing a manufacturing method in time series.

A manufacturing method for a group-III nitride crystal according to a first aspect, includes: preparing a seed substrate; increasing temperature of the seed substrate placed in a nurturing chamber; and supplying a group-III element oxide gas produced in a raw material chamber that is connected to the nurturing chamber by a connecting pipe and a nitrogen element-containing gas into the nurturing chamber to grow a group-III nitride crystal on the seed substrate, and a flow amount y of a carrier gas supplied into the raw material chamber at the temperature increase step satisfies the following two relational equations (I) and (II).

$$y < [1-k*H(Ts)]/[k*H(Ts)-j*H(Tg)]*j*H(Tg)*t \quad (I)$$

$$y \geq 1.58*10^{-4}*(22.4/28)S*F(N)/F(T) \quad (II)$$

In the above, k represents the arrival rate to the saturated vapor pressure of a group-III element in the raw material chamber, Ts represents the temperature of the raw material chamber, Tg represents the temperature of the nurturing chamber, H(Ts) represents the saturated vapor pressure of the group-III element at the temperature Ts in the raw material chamber, H(Tg) represents the saturated vapor pressure of the group-III element at the temperature Tg in the nurturing chamber, j represents a corrective coefficient, t represents the sum of gas flow amounts flowing into the nurturing chamber from those other than the raw material chamber, S represents the cross-sectional area of the connecting pipe, F(N) represents a volumetric flow amount of the nitrogen element-containing gas supplied into the nurturing chamber, and F(T) represents the sum of volumetric flow amounts of gases supplied into the nurturing chamber 111 from those other than the raw material chamber.

In a manufacturing method for a group-III nitride crystal according to a second aspect, increasing temperature may be executed in a temperature increase process at a temperature that is 500° C. or higher and lower than 1,050° C. before the growth step in the above first aspect.

In a manufacturing method for a group-III nitride crystal according to a third aspect, increasing temperature may be executed in a mixed atmosphere of an inert gas and the nitrogen element-containing gas in the above first or second aspect.

A manufacturing apparatus for a group-III nitride crystal and a manufacturing method for a group-III nitride crystal according to embodiments will be described below with reference to the accompanying drawings. In the drawings, members substantially identical to each other are denoted by same reference numerals.

First Embodiment

<Overview of Manufacturing Method for a Group-III Nitride Crystal>

Figure 1B:
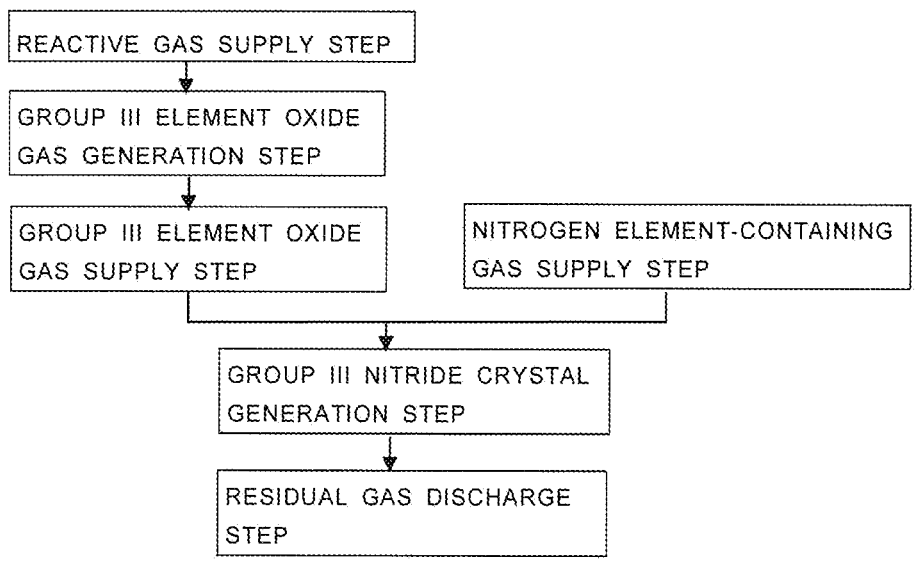
FIG. 1B is a flowchart showing as steps functional units from the upstream to the downstream in a manufacturing apparatus used in the manufacturing method, for a group-III nitride crystal according to a first embodiment of the present disclosure.

An overview of the manufacturing method for a group-III nitride crystal according to this first embodiment will be described with reference to a flowchart in FIG. 1 and FIG. 2. FIG. 1A shows a time-series flowchart of the manufacturing method. FIG. 1B shows as steps the functional units from the upstream toward the downstream in the manufacturing apparatus used in this manufacturing method.

As shown in FIG. 1A, the manufacturing method for a group-III nitride crystal includes a step of preparing the seed substrate, a step of increasing temperature of the seed substrate in an inert gas atmosphere, a step of increasing temperature of the seed substrate in a nitrogen element-containing gas atmosphere, a step of supplying the group-III element oxide gas and the nitrogen element-containing gas to grow a group-III nitride crystal on the seed substrate, a step of decreasing the temperature concurrently resolution-suppressing resolution of the group-III nitride crystal in the nitrogen element-containing gas atmosphere, a step of decreasing the temperature of the group-III nitride crystal in an inert gas atmosphere, and a step of taking out the group-III nitride crystal.

<Seed Substrate Preparation Step>

At a seed substrate preparation step of preparing the seed substrate 116, the seed substrate 116 is placed on the substrate susceptor 117.

<Temperature Increase Step>

In this embodiment, the manufacturing method for a group-III nitride crystal includes a temperature increase step. At the temperature increase step, the temperature of the nurturing chamber 111 is increased to be 100° C. or higher and lower than 500° C. in an inert gas atmosphere.

<Resolution Protective Temperature Increase Step>

At the resolution protective temperature increase step, the temperature of the nurturing chamber 111 is increased to be 500° C. or higher and lower than 1,000° C. in an $NH_3$ gas atmosphere.

<Growth Step>

At a growth step, the group-III element oxide gas is produced in the raw material chamber 100 and is supplied into the nurturing chamber 111 and the nitrogen element-containing gas is supplied into the nurturing chamber 111 to thereby execute production of a group-III nitride crystal on the seed substrate 116.

As shown in FIG. 1B, the growth step includes a reactive gas supply step, a group-III element oxide gas production step, a group-III element oxide gas supply step, a nitrogen element-containing gas supply step, a group-III nitride crystal production step, and a residual gas discharge step. The steps included in the growth step may concurrently be executed in the manufacturing apparatus for a group-III nitride crystal. The steps included in the growth step, as shown in FIG. 2, are indicated as steps of the functional units from the upstream toward the downstream in the manufacturing apparatus used in this manufacturing method.

<Reactive Gas Supply Step>

At a reactive gas supply step, a reactive gas is supplied into a raw material reaction chamber.

<Group-III Element Oxide Gas Production Step>

At a group-III element oxide gas production step, a starting group-III element source and the reactive gas (that is a reducing gas in the case where the starting group-III element source is an oxide and that is an oxidizing gas in the case where the starting group-III element source is a metal) are reacted with each other to produce the group-III element oxide gas.

<Group-III Element Oxide Gas Supply Step>

At a group-III element oxide gas supply step, the group-III element oxide gas manufactured at the group-III element oxide gas production step is supplied into the nurturing chamber.

<Nitrogen Element-Containing Gas Supply Step>

At a nitrogen element-containing gas supply step, the nitrogen element-containing gas is supplied into the nurturing chamber.

<Group-III Nitride Crystal Production Step>

At a group-III nitride crystal production step, the group-III element oxide gas supplied into the nurturing chamber at the group-III element oxide gas supply step and the nitrogen element-containing gas supplied into the nurturing chamber at the nitrogen element-containing gas supply step are reacted with each other to grow a group-III nitride crystal on the seed substrate.

<Residual Gas Discharge Step>

At a residual gas discharge step, unreacted gases that do not contribute to the production of the group-III nitride crystal are discharged to the exterior of the chamber.

<Resolution Protective Temperature Decrease Step>

In this first embodiment, the manufacturing method for a group-III nitride crystal includes a resolution protective temperature decrease step. At the resolution protective temperature decrease step, to suppress resolution of the group-III nitride crystal grown on the seed substrate 116, the temperature of each of the raw material chamber 100 and the nurturing chamber 111 is decreased to 500° C. concurrently supplying an $NH_3$ gas.

<Temperature Decrease Step>

In this first embodiment, the manufacturing method for a group-III nitride crystal includes a temperature decrease step. At the temperature decrease step, the temperature of each of the raw material chamber 100 and the nurturing chamber 111 is decreased to be lower than 100° C. in an inert gas atmosphere.

<Taking Out Step>

In this first embodiment, the manufacturing method for a group-III nitride crystal includes a taking out step. At the taking out step, the seed substrate 116 having the group-III nitride crystal grown thereon is taken out from the nurturing chamber 111.

<Overview of Manufacturing Apparatus for Group-III Nitride Crystal>

An overview of a manufacturing apparatus for a group-III nitride crystal, that is used in the manufacturing method for a group-III nitride crystal according to this first embodiment will first be described with reference to FIG. 2.

Figure 2:
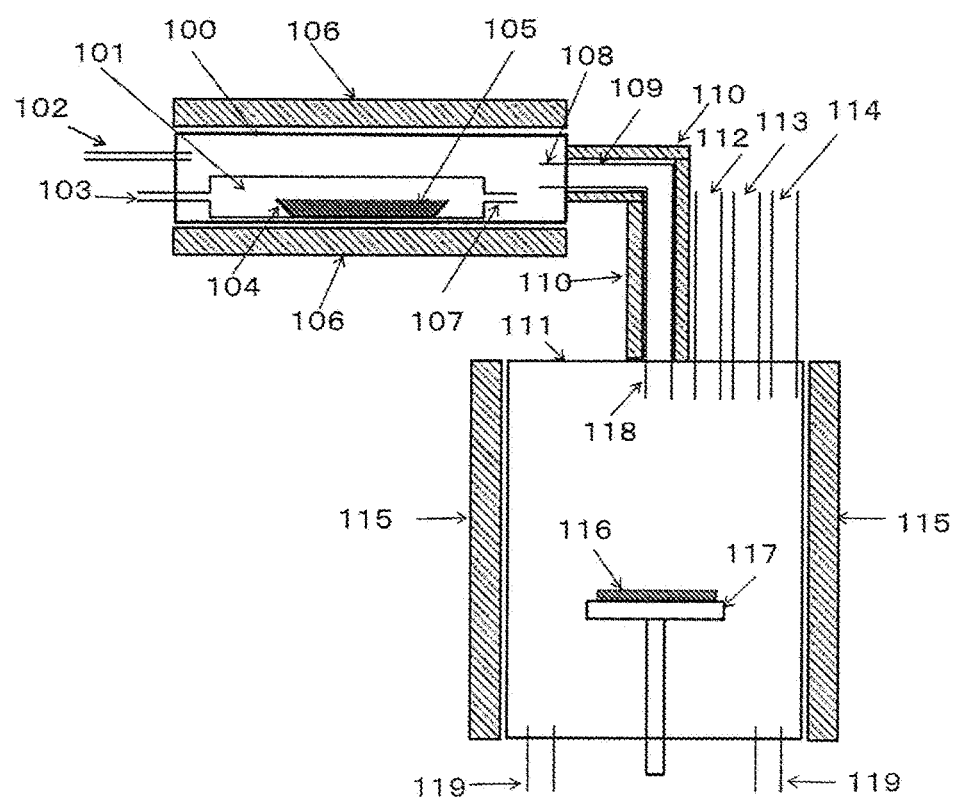
FIG. 2 is a schematic diagram of the manufacturing apparatus for a group-III nitride crystal according to the first embodiment of the present disclosure.

In FIG. 2, the sizes, the proportions, and the like of the constituent members may be different from the actual ones.

The manufacturing apparatus for a group-III nitride crystal includes a raw material chamber 100 and a nurturing chamber 111. The raw material chamber 100 produces therein a group-III element oxide gas. The nurturing chamber 111 reacts therein the group-III element oxide gas supplied from the raw material chamber 100 and a nitrogen element-containing gas with each other to produce a group-III nitride crystal on a seed substrate.

A raw material reaction chamber 101 is disposed in the raw material chamber 100, and a raw material boat 104 on which a starting group-III element source 105 is mounted is disposed in the raw material reaction chamber 101. A reactive gas supply pipe 103 to supply a gas that reacts with the starting group-III element source 105 is connected to the raw material reaction chamber 101. The raw material reaction chamber 101 includes a group-III element oxide gas discharge outlet 107 to discharge the produced group-III element oxide gas. In the case where the starting group-III source is an oxide, a reducing gas is used as the reactive gas. In the case where the starting group-III source is a metal, an oxidizing gas is used as the reactive gas.

A first carrier gas supply inlet 102 to supply a first carrier gas is connected to the raw material chamber 100. The first carrier gas supplied from the first carrier gas supply inlet 102 and the group-III element oxide gas discharged from the group-III element oxide gas discharge outlet 107 flow from a gas discharge outlet 108 into the nurturing chamber 111 passing through a connecting pipe 109. The first carrier gas and the group-III element oxide gas are supplied into the nurturing chamber 111 from a gas supply inlet 118 connected to the nurturing chamber 111. The nurturing chamber 111 includes the gas supply inlet 118, a third carrier gas supply inlet 112, a nitrogen element-containing gas supply inlet 113, a second carrier gas supply inlet 114, and a gas discharge outlet 119. The nurturing chamber 111 includes a substrate susceptor 117 on which the seed substrate 116 is placed.

<Details of Manufacturing Method and Manufacturing Apparatus for Group-III Nitride Crystal>

The manufacturing method for a group-III nitride crystal according to this first embodiment will be described in detail with reference to FIGS. 1A and 1B and FIG. 2.

In this first embodiment, metallic Ga is used as the starting group-III element source 105 and the starting group-III element source 105 is however not limited to this. For example, Al or In may also be used.

<Seed Substrate Preparation Step>

The seed substrate 116 is first prepared. For example, gallium nitride, gallium arsenide, silicon, sapphire, silicon carbide, zinc oxide, gallium oxide, and $ScAlMgO_4$ are each usable as the seed substrate 116. In this embodiment, gallium nitride is used as the seed substrate 116.

<Temperature Increase Step>

At the temperature increase step, the temperature of the nurturing chamber is increased in an inert gas atmosphere to a temperature at which no resolution of the seed substrate 116 occurs. In the manufacture of a group-III nitride crystal using the OVPE method, heating is executed for the temperature to be about 500° C. in an inert gas (such as, for example, an $N_2$ gas) atmosphere.

<Resolution Protective Temperature Increase Step>

At the resolution protective temperature increase step, the temperature is increased in a nitrogen element-containing gas atmosphere concurrently suppressing resolution of the seed substrate 116. In the manufacture of a group-III nitride crystal using the OVPE method, heating is executed until the temperature becomes 500° C. or higher and lower than 1,050° C. in the state where an inert gas and an $NH_3$ gas that is a nitrogen element-containing gas are mixed with each other. The reason why the $NH_3$ gas is mixed is to prevent the seed substrate 116 from being resolved by desorption of N atoms.

At the resolution protective temperature increase step, a carrier gas is supplied from the reactive gas supply pipe 103. For example, an inert gas or an $H_2$ gas is usable as the carrier gas. The reason why the carrier gas is supplied from the reactive gas supply pipe 103 is to suppress a backward flow of the nitrogen element-containing gas supplied into the nurturing chamber 111, into the raw material chamber 100. In this case, the evaporation amount of the metallic Ga that is the starting group-III element source 105 placed on the raw material boat 104 becomes large when the flow amount of the carrier gas supplied from the reactive gas supply pipe 103 and the supply amount of the first carrier gas supplied from the first carrier gas supply inlet 102 are large, and the evaporated metallic Ga therefore tends to move from the raw material chamber 100 into the nurturing chamber 111. At the resolution protective temperature increase step, in the case where the metallic Ga is supplied onto the seed substrate 116 in the nurturing chamber 111, Ga droplets are generated on the need substrate 116 when the vapor pressure of the supplied metallic Ga exceeds the saturated vapor pressure of Ga. The generated droplets become abnormal growth sources such as poly-crystals and penetrating pits when a group-III nitride crystal is grown at the growth step. To reduce the supply of the Ga vapor into the nurturing chamber 111, it can be considered that the gas flow amount of each of the carrier gas and the first carrier gas that are supplied into the raw material chamber 100 is reduced.

The nitrogen element-containing gas supplied into the nurturing chamber 111 however flows backward into the raw material chamber 100 when the gas flow amount of each of the carrier gas and the first carrier gas is reduced. In the case where the backward flow of the $NH_3$ gas that is the nitrogen element-containing gas into the raw material chamber 100 occurs, Ga and $NH_3$ react with each other on the metallic Ga that is the starting group-III element source in the raw material chamber 100, to produce GaN and a phenomenon of covering the surface of the metallic Ga occurs. In the case where the metallic Ga is covered with GaN, even when the reactive gas is supplied into the raw material chamber 100 at the growth step, the reaction between the metallic Ga and the reactive gas is obstructed and the group-III element oxide gas is unable to be produced in a desired amount. It is necessary to simultaneously suppress the diffusion of the metallic Ga vapor onto the seed substrate 116 and the backward flow of the nitrogen element-containing gas into the raw material chamber 100. To simplify the understanding, it is assumed that the gas supplied into the raw material chamber 100 at the resolution protective temperature increase step is only the $N_2$ gas that is the carrier gas from the reactive gas supply pipe. It is also assumed that the pressure is 1 atm.

The suppression of the diffusion of the Ga vapor onto the seed substrate 116 will first be discussed.

The volumetric flow amount of the Ga vapor in the raw material chamber 100 will first be considered. In the case where the partial pressure of the Ga vapor in the raw material chamber 100 is denoted by "x" (atm), the volumetric flow amount of $N_2$ that is the carrier gas supplied into the raw material chamber 100 is denoted by "y" (L/min), and the volumetric flow amount of the Ga vapor is denoted by "z" (L/min), the Ga gas in the raw material chamber 100 and the $N_2$ gas ($N_2$:Ga) have the relation of Eq. (III).

$$1-x:x=y:z \qquad (III)$$

Transformation of the above for z gives Eq. (IV) that represents z.

$$z=(x*y)/(1-x) \qquad (IV)$$

The partial pressure of the Ga vapor at the time when the Ga vapor is supplied into the nurturing chamber 111 will next be considered. The gas flow amount of those other than the Ga vapor, that are supplied into the nurturing chamber 111 is denoted by "T" (L/min) and the gas flow amount supplied into the nurturing chamber 111 from those other than the raw material chamber 100 is denoted by "t" (L/min). The gas flow amount of those other than the Ga vapor, that is supplied into the nurturing chamber 111 means the sum of the gas flow amount of those other than the Ga vapor, that are supplied from the raw material chamber 100 and the gas flow amount supplied from those other than the raw material chamber 100 into the nurturing chamber 111. In this case, T presents the relation of the following Eq. (V).

$$T=y+t \qquad (V)$$

The partial pressure of the Ga gas in the nurturing chamber 111 is x/(T+z). In the case where the saturated vapor pressure of Ga in a seed substrate 116 part is denoted by "H(Tg)" (atm), because the Ga droplets are generated when the partial pressure of the Ga gas exceeds the Ga saturated vapor pressure, the Ga gas flow amount z needs to maintain the following Eq. (VI) to suppress the generation of any Ga droplets on the seed substrate 116.

$$z/(T+z)<j*H(Tg) \qquad (VI)$$

In the above, j is a corrective coefficient. As the result of thorough experimental consideration, the value of j was determined as $2.25*10^{-3}$. Substituting Eq. (IV) and Eq. (V) in Eq. (VI) therefore enables expression of Eq. (VII).

$$Y<(1-x)/[x-j*H(Tg)]*j*H(Tg)*t \qquad (VII)$$

Further assuming that (k*100)% of the Ga vapor in the raw material chamber 100 arrives at the saturated vapor pressure, the partial pressure x of the Ga vapor in the raw material chamber 100 can be represented as the following Eq. (VIII) denoting the Ga saturated vapor pressure in the raw material chamber 100 as "H(Ts)". In this case, k is the ratio of the Ga vapor relative to the saturated vapor pressure H(Ts) in the raw material chamber 100.

$$x=k*H(Ts) \qquad (VIII)$$

Substituting Eq. (VIII) in Eq. (VII) gives Eq. (IX).

$$y<[1-k*H(Ts)]/[k*H(Ts)-j*H(Tg)]*j*H(Tg)*t \qquad (IX)$$

H(Ts) and H(Tg) are represented by the following Eqs.

$$H(Ts)=EXP[-\Delta G(Ts)/(R \times Ts)] \qquad (X)$$

$$H(Tg)=EXP[-\Delta G(Tg)/(R \times Tg)] \qquad (XI)$$

Figure 3:
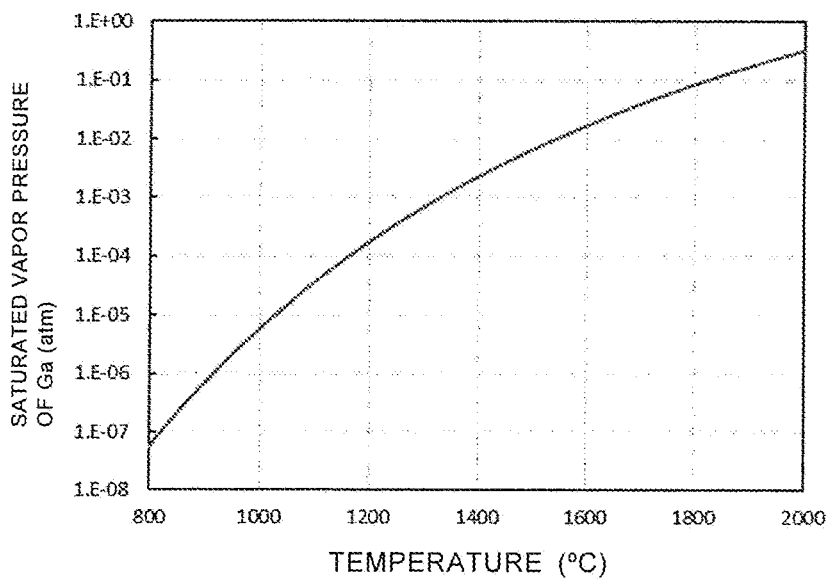
FIG. 3 is a graph showing the relation between the temperature and the saturated vapor pressure of Ga.

Ts and Tg are the temperatures respectively of the raw material chamber 100 and the nurturing chamber 111. R is the gas constant, and $\Delta G$ is the Gibbs potential of the Ga gas that is determined in accordance with the temperature of each of the raw material chamber 100 and the nurturing chamber 111. The volumetric flow amount y of the $N_2$ gas supplied to the raw material chamber 100 therefore only has to be in a range that satisfies Eq. (IX) that is represented using Eq. (X) and Eq. (XI). FIG. 3 shows the relation between the Ga saturated vapor pressure and the temperature, as reference.

The suppression of the backward flow of $NH_3$ that is the nitrogen element-containing gas into the raw material chamber 100 will second be discussed.

The mass flow amount of the $N_2$ gas supplied into the raw material chamber 100 is denoted by "X" (g/min), the cross-sectional area of the connecting pipe 109 is denoted by "S" ($mm^2$), the volumetric flow amount of the $NH_3$ gas supplied into the nurturing chamber 111 is denoted by "F($NH_3$)" (L/min), and the volumetric flow amount of the gas supplied from those other than the raw material chamber 100 into the nurturing chamber 111 is denoted by F(T) (L/min). The concentration of the $NH_3$ gas in the nurturing chamber 111 in the gas supplied from those other than the raw material chamber 100 into the nurturing chamber 111 can be represented by $F(NH_3)/F(T)$.

It can be considered that the backward flow of $NH_3$ that is the nitrogen element-containing gas, into the raw material chamber 100 is more suppressed as the mass flow amount X (g/min) of the $N_2$ gas that is the carrier gas supplied into the raw material chamber 100 is larger. It can also be considered that the backward flow of $NH_3$ into the raw material chamber 100 is more suppressed as the cross-sectional area S of the connecting pipe 109 is smaller. It can further be considered that the backward flow of $NH_3$ into the raw material chamber 100 is more suppressed as the inverse of the volumetric flow amount $F(NH_3)$ of the $NH_3$ gas is greater. It can further be considered that the backward flow of $NH_3$ into the raw material chamber 100 is more suppressed as the volumetric flow amount F(T) (L/min) of the gas supplied from those other than the raw material chamber 100 into the nurturing chamber 111 is larger.

From the above relations, the value of "A" is considered that is represented by Eq. (XII) whose numerator includes the mass flow amount X (g/min) of the $N_2$ gas and the volumetric flow amount F(T) (L/min) of the gas supplied from those other than the raw material chamber 100 into the nurturing chamber 111 that each have a positive correlation with the suppression of the backward flow of $NH_3$ into the raw material chamber 100 and whose denominator includes the cross-sectional area S of the connecting pipe 109 and the volumetric flow amount $F(NH_3)$ (L/min) of the $NH_3$ gas that each have a negative correlation therewith. This A is a parameter to determine the suppression of the backward flow of the $NH_3$ gas from the nurturing chamber 111 into the war material chamber 100, and it can be determined that the backward flow of $NH_3$ into the raw material chamber 100 can be suppressed in the case where the numeral value of A is greater than a predetermined value.

$$A=(X/S)*(F(T)/F(NH_3))=(X*F(T))/(S*F(NH_3)) \quad (XII)$$

The lower limit value of A with which the backward flow of $NH_3$ into the raw material chamber 100 and that was derived as the result of thorough experimental consideration was $1.58*10^{-4}$.

When the volumetric flow amount of the $N_2$ gas supplied into the raw material chamber 100 is denoted y (L/min), using the molar volume of 22.4 L/mol in the standard state and the molecular weight of 28 g/mol of the $N_2$ gas, the mass flow amount X of the $N_2$ gas supplied from the raw material chamber 100 is represented by Eq. (XIII).

$$X=y*(28/22.4) \quad (XIII)$$

Substituting Eq. (XIII) in Eq. (XII) gives the following.

$$y \geq A*(22.4/28)*S*F(NH_3)/F(T) \quad (XIV)$$

Substituting the lower limit value of A, y needs to satisfy the relation of the following Eq. (XV).

$$y \geq 1.58*10^{-4}*(22.4/28)S*F(NH_3)/F(T) \quad (XV)$$

Figure 4:
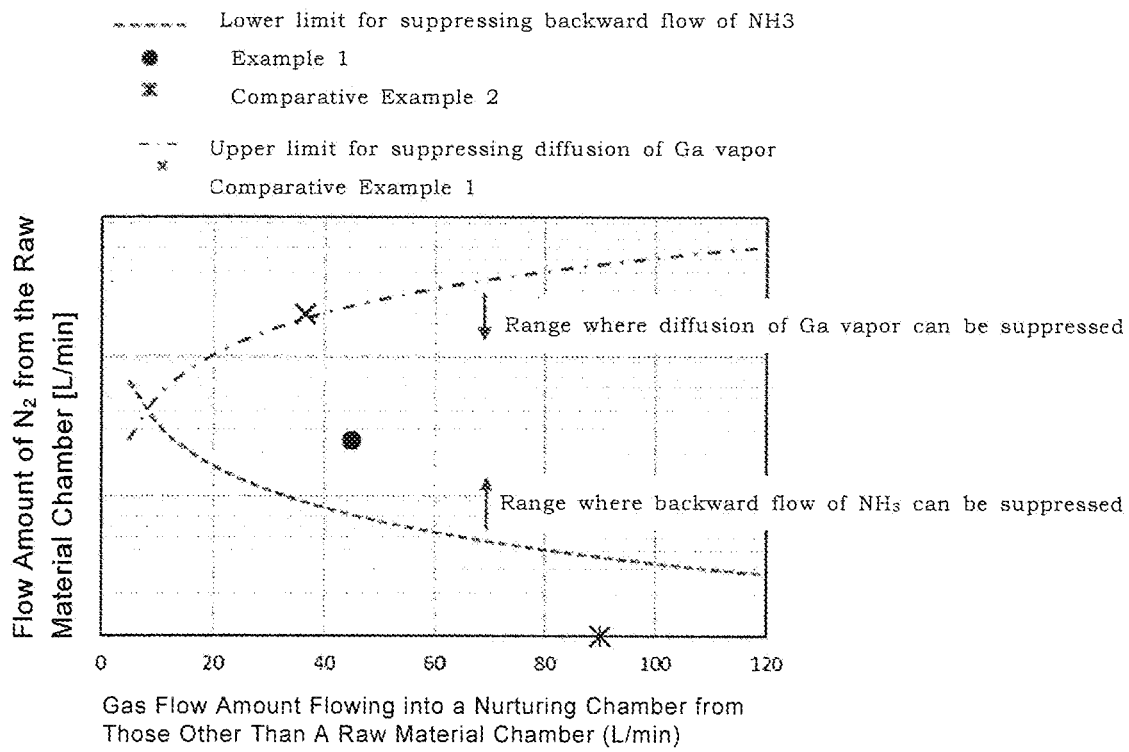
FIG. 4 is a graph showing the relations between a gas flow amount flowing into a nurturing chamber from those other than a raw material chamber, and diffusion of a Ga vapor and a backward flow of an $NH_3$ gas for an $N_2$ flow amount from the raw material chamber.

Summarizing the above content, the volumetric flow amount y of the carrier gas supplied into the raw material chamber 100 at the resolution protective temperature increase step only has to be adjusted to be in the range that simultaneously satisfies Eqs. (IX) and (XV). For example, the flow amount F(T) of the gas flowing from those other than the raw material chamber into the nurturing chamber and the flow amount of $N_2$ from the raw material chamber only have to be adjusted to be in the range that is equal to or higher than a dotted line showed in FIG. 4 and equal to or lower than a dashed-dotted line showed therein. The diffusion of the Ga vapor supplied from the raw material chamber 100 to the seed substrate 116 can thereby be suppressed and the backward flow of the nitrogen element-containing gas into the raw material chamber 100 can also be suppressed. In FIG. 4, the flow amount of $N_2$ from the raw material chamber is represented by the volumetric flow amount, and the volumetric flow amount and the mass flow amount can be converted into each other.

<Growth Step>

At the growth step, the group-III element oxide gas is produced in the raw material chamber 100 and is supplied into the nurturing chamber 111 and the nitrogen element-containing gas is supplied into the nurturing chamber 111 to execute production of a group-III nitride crystal on the seed substrate 116. For example, the growth step includes the reactive gas supply step, the group-III element oxide gas production step, the group-III element oxide gas supply step, the nitrogen element-containing gas supply step, the group-III nitride crystal production step, and the residual gas discharge step.

<Reactive Gas Supply Step>

At the reactive gas supply step, the reactive gas is supplied from the reactive gas supply pipe 103 into the raw material reaction chamber 101 in the raw material chamber 100. As above, a reducing gas or an oxidizing gas is usable as necessary as the reactive gas. In this embodiment, because the metallic Ga is used as the group-III element source 105, the $H_2O$ gas is used as the reactive gas.

<Group-III Element Oxide Gas Production Step>

At the group-III element oxide gas production step, the reactive gas supplied into the raw material reaction chamber 101 at the reactive gas supply step reacts with Ga that is the starting group-III element source 105 to produce a $Ga_2O$ gas that is the group-III element oxide gas. The produced $Ga_2O$ gas is discharged from the raw material reaction chamber 101 into the raw material chamber 100 through the group-III element oxide gas discharge outlet 107. The discharged $Ga_2O$ gas is mixed with the first carrier gas supplied from the first carrier gas supply inlet 102 into the raw material chamber and the mixed gases are supplied to the gas discharge outlet 108.

In this embodiment, the raw material chamber 100 is heated by a first heater 106. In the case where the raw material chamber 100 is heated, from the viewpoint of the boiling point of the $Ga_2O$ gas, it is preferred that the temperature of the raw material chamber 100 be 800° C. or higher. It is preferred that the temperature of the raw material chamber 100 be lower than the temperature of the nurturing chamber 111. As described later, in the case where the nurturing chamber is heated by a second heater 115, it is preferred that the temperature of the raw material chamber 100 be, for example, lower than 1,800° C.

The starting group-III element source 105 is placed in the raw material boat 104 disposed in the raw material reaction chamber 101. It is preferred that the raw material boat 104 have a shape capable of setting a large contact area for the reactive gas and the starting group-III element source between each other. To prevent the starting group-III element source 105 and the reactive gas from passing through the raw material reaction chamber 101 without contacting each other, it is preferred that the raw material boat 104 have, for example, a multiple-stage tray shape.

Methods of producing the group-III element oxide gas are roughly classified into a method of reducing the starting group-III element source 105 and a method of oxidizing the starting group-III element source 105. For example, in the method of reducing, an oxide (such as, for example, $Ga_2O_3$) is used as the starting group-III element source 105 and a reducing gas (such as, for example, an $H_2$ gas, a CO gas, a $CH_4$ gas, a $C_2H_6$ gas, an $H_2S$ gas, or an $SO_2$ gas) is used as the reactive gas. On the other hand, in the method of oxidizing, a non-oxide (such as, for example, liquid Ga) is used as the starting group-III element source 105 and an oxidizing gas (such as for example, an $H_2O$ gas, an $O_2$ gas, a CO gas, a $CO_2$ gas, an NO gas, an $N_2O$ gas, or an $NO_2$ gas) is used as the reactive gas. In addition to a Ga source as the starting group-III element source 105, an In source and an Al source can each be employed as the starting group-III element. An inert gas, an $H_2$ gas, or the like is usable as the first carrier gas.

At the group-III element oxide gas supply step, the $Ga_2O$ gas produced at the group-III element oxide gas production step is supplied into the nurturing chamber 111 through the gas discharge outlet 108, the connecting pipe 109, and the gas supply inlet 118. When the temperature of the connecting pipe 109 connecting the raw material chamber 100 and the nurturing chamber 111 to each other becomes lower than the temperature of the raw material chamber 100, a reverse reaction of the reaction to produce the group-III element oxide gas occurs and the starting group-III element source 105 precipitates in the connecting pipe 109. It is therefore preferred that the connecting pipe 109 be heated by a third heater 110 at a temperature that is higher than the temperature of the first heater 106 to prevent the temperature of the connecting pipe 109 from becoming lower than the temperature of the raw material chamber 100.

<Nitrogen Element-Containing Gas Supply Step>

At the nitrogen element-containing gas supply step, the nitrogen element-containing gas is supplied from the nitrogen element-containing gas supply inlet 113 into the nurturing chamber 111. Examples of the nitrogen element-containing gas include an $NH_3$ gas, an NO gas, an $NO_2$ gas, an $N_2O$ gas, an $N_2H_2$ gas, and an $N_2H_4$ gas.

<Group-III Nitride Crystal Production Step>

At the group-III nitride crystal production step, the raw material gases supplied into the nurturing chamber through the supply steps are reacted with each other to grow a group-III nitride crystal on the seed substrate 116. It is preferred that the nurturing chamber 111 be heated by the second heater 115 to reach a high temperature at which the group-III element oxide gas and the nitrogen element-containing gas react with each other. At this time, as to the temperature of the nurturing chamber 111, to avoid occurrence of any reverse reaction of the reaction to produce the group-III element oxide gas, it is preferred that the temperature of the nurturing chamber 111 be controlled to avoid becoming lower than the temperature of the raw material chamber 100. It is preferred that the temperature of the nurturing chamber 111 heated by the second heater 115 be 1,000° C. or higher and 1,800° C. or lower. For the reason of suppressing temperature fluctuation of the nurturing chamber 111 caused by the $Ga_2O$ gas produced in the raw material chamber 100 and the first carrier gas, it is desirable that the temperature of the second heater 115 and that of the third heater 110 be equal to each other.

A group-III nitride crystal can be grown on the seed substrate 116 by mixing the group-III element oxide gas supplied into the nurturing chamber 111 through the group-III element oxide gas supply step and the nitrogen element-containing gas supplied into the nurturing chamber 111 through the nitrogen element-containing gas supply step on the upstream side of the seed substrate 116. An inert gas, an $H_2$ gas, or the like is usable as the second carrier gas.

Such steps included in the growth step as the reactive gas supply step, the group-III element oxide gas production step, the group-III element oxide gas supply step, the nitrogen element-containing gas supply step, the group-III nitride crystal production step, and the residual gas discharge step may concurrently be executed.

<Residual Gas Discharge Step>

At the residual gas discharge step, a portion of the group-III element oxide gas and a portion of the nitrogen element-containing gas that are unreacted, the first carrier gas, the second carrier gas, and the third carrier gas are discharged from the gas discharge outlet 119.

<Resolution Protective Temperature Decrease Step>

At the resolution protective temperature decrease step, the temperature is decreased concurrently suppressing resolution of the group-III nitride crystal in a nitrogen element-containing gas atmosphere. In the manufacture of the group-III nitride crystal using the OVPE method, cooling is executed to 500° C. or lower in the state where an inert gas and a nitrogen element-containing gas that is an $NH_3$ gas are mixed with each other.

<Temperature Decrease Step>

At the temperature decrease step, the temperature is decreased in an inert gas atmosphere to a temperature at which the group-III nitride crystal can be taken put from the nurturing chamber.

<Taking Out Step>

In this embodiment, the seed substrate 116 having the group-III nitride crystal grown thereon is taken out from the nurturing chamber 111 after the temperature decrease step.

EXAMPLES

Experiments were conducted for steps to the resolution protective temperature increase step, using a growth furnace showed in FIG. 2. For these experiments, the case of growing GaN as a group-III nitride crystal was assumed. Liquid Ga was used as the starting group-III element source, and an $NH_3$ gas was used as the nitrogen element-containing gas. A mixture of an $H_2$ gas and an $N_2$ gas was used as each of the first carrier gas and the second carrier gas. Verification was conducted with the time period taken up to the resolution protective temperature increase step to be 85 minutes. A GaN substrate was used as the seed substrate.

The generation of poly-crystals and pits to be the starting points of Ga droplets due to the diffusion of the Ga vapor was evaluated by observation of surface photoluminescence (PL) images or observation using an atomic force microscope (AFM). The generation of GaN on the metal Ga in the raw material boat due to the backward flow of the $NH_3$ gas was checked by visual observation.

Example 1

The substrate was heated to increase its temperature from 500° C. to 1,050° C. and the raw material was heated to increase its temperature from 500° C. to 900° C. as the conditions for the resolution protective temperature increase step. The flow amount of the $N_2$ gas supplied into the raw material chamber was set to be 0.25 L/min, the flow amount of the $NH_3$ gas supplied thereinto was set to be 10 L/min, and the flow amounts of the other $N_2$ gases were each set to be 35 L/min. As the result of evaluation of the substrate after the temperature had been increased to the desired temperature and had been decreased, no generation of poly-crystals and pits to be the starting points of Ga droplets on the crystal surface was recognized. No generation of GaN on the metallic Ga in the raw material boat was recognized.

Comparative Example 1

The substrate was heated to increase its temperature from 500° C. to 1,050° C. and the raw material was heated to increase its temperature from 500° C. to 900° C. as the conditions for the resolution protective temperature increase step. The flow amount of the $N_2$ gas supplied into the raw material chamber was set to be 2 L/min, the flow amount of the $NH_3$ gas supplied thereinto was set to be 10 L/min, and the flow amounts of the other $N_2$ gases were each set to be 29 L/min. As the result of evaluation of the substrate after the temperature had been increased to the desired temperature and had been decreased, generation of poly-crystals and pits to be the starting points of Ga droplets on the crystal surface was observed. No generation of GaN on the metallic Ga in the raw material boat was recognized.

Comparative Example 2

The substrate was heated to increase its temperature from 500° C. to 1,050° C. and the raw material was heated to increase its temperature from 500° C. to 900° C. as the conditions for the resolution protective temperature increase step. The flow amount of the $N_2$ gas supplied into the raw material chamber was set to be smaller than 0.01 L/min, the flow amount of the $NH_3$ gas supplied thereinto was set to be 15 L/min, and the flow amounts of the other $N_2$ gases were each set to be 75 L/min. As the result of evaluation of the substrate after the temperature had been increases to the desired temperature and had been decreased, no generation of poly-crystals and pits to be the starting points of Ga droplets on the crystal surface was observed. Generation of GaN on the metallic Ga in the raw material boat was recognized.

Summary of Example and Comparative Examples

FIG. 4 shows the evaluation results of Example and Comparative Examples. FIG. 4 also shows the upper limit value and the lower limit value of the $N_2$ flow amount capable of being supplied into the raw material chamber, described in <Details of Manufacturing Method and Manufacturing Apparatus for Group-III Nitride Crystal>. Because Example 1 is in a desired region, Example 1 simultaneously satisfies the suppression of the diffusion of the Ga vapor and the suppression of the backward flow of the $NH_3$ gas, no generation of poly-crystals and pits to be the starting points of Ga droplets on the seed substrate was recognized, and no generation of GaN on the metallic Ga in the raw material boat was also recognized.

On the other hand, in the case of Comparative Example 1, the lower limit value for the suppression of the backward flow of $NH_3$ was exceeded and no generation of GaN on the metallic Ga in the raw material boat was therefore recognized while the upper limit value for the suppression of the diffusion of the Ga vapor onto the seed substrate was exceeded and generation of poly-crystals and pits to be the starting points of Ga droplets on the seed substrate was therefore recognized.

In the case of Comparative Example 2, the upper limit value for the suppression of the diffusion of the Ga vapor onto the seed substrate was not exceeded and no generation of poly-crystals and pits to be the starting points of Ga droplets on the seed substrate was therefore recognized while the $N_2$ flow amount is below the lower limit value for the suppression of the backward flow of $NH_3$ and generation of GaN on the metallic Ga in the raw material boat was therefore recognized Those each acquired by combining as necessary optional embodiment and/or Example of the above various embodiments and/or Examples are included in the present disclosure, and each achieve the effects that are achieved by the optional embodiment and/or Example.

| | |
|---|---|
| 100 | raw material chamber |
| 101 | raw material reaction chamber |
| 102 | first carrier gas supply inlet |
| 103 | reactive gas supply pipe |
| 104 | raw material boat |
| 105 | starting group-III element source |
| 106 | first heater |
| 107 | group-III element oxide gas discharge outlet |
| 108 | gas discharge outlet |
| 109 | connecting pipe |
| 110 | third heater |
| 111 | nurturing chamber |
| 112 | third carrier gas supply inlet |
| 113 | nitrogen element-containing gas supply inlet |
| 114 | second carrier gas supply inlet |
| 115 | second heater |
| 116 | seed substrate |
| 117 | substrate susceptor |
| 118 | gas supply inlet |
| 119 | gas discharge outlet |

What is claimed is:

1. A manufacturing method for a group-III nitride crystal, the manufacturing method comprising:
   preparing a seed substrate;
   increasing temperature of the seed substrate placed in a nurturing chamber; and
   supplying a group-III element oxide gas produced in a raw material chamber that is connected to the nurturing chamber by a connecting pipe and a nitrogen element-containing gas into the nurturing chamber to grow a group-III nitride crystal on the seed substrate,
   wherein a flow amount y (L/min) of a carrier gas supplied into the raw material chamber at the temperature increase step satisfies following two relational equations (I) and (II), $$y < [1-k*H(Ts)]/[k*H(Ts)-j*H(Tg)]*j*H(Tg)*t \qquad (I)$$

$$y \geq 1.58*10^{-4}*(22.4/28)S*F(N)/F(T) \qquad (II)$$

wherein k represents an arrival rate to a saturated vapor pressure of a group-III element in the raw material chamber,
   wherein Ts (° C.) represents a temperature of the raw material chamber,
   wherein Tg (° C.) represents a temperature of the nurturing chamber,
   wherein H(Ts) (atm) represents a saturated vapor pressure of the group-III element at the temperature Ts in the raw material chamber,
   wherein H(Tg) (atm) represents a saturated vapor pressure of the group-III element at the temperature Tg in the nurturing chamber,
   wherein j represents a corrective coefficient,
   wherein t (L/min) represents a sum of gas flow amounts flowing into the nurturing chamber from those other than the raw material chamber,
   wherein S ($mm^2$) represents a cross-sectional area of the connecting pipe, wherein F(N) (L/min) represents a volumetric flow amount of the nitrogen element-containing gas supplied into the nurturing chamber, and wherein F(T) (L/min) represents a sum of volumetric flow amounts of gases supplied into the nurturing chamber from those other than the raw material chamber, and wherein a flow amount z (L/min) of a group-III element vapor supplied into the raw material chamber satisfies following equation (IV), $$z=(x*y)/(1-x) \quad \text{(IV)}$$

wherein x (atm) represents a partial pressure of the group-III element vapor in the raw material chamber, and wherein y (L/min) represents the flow amount y (L/min) of the carrier gas supplied into the raw material chamber at the temperature increase step that satisfies the two relational equations (I) and (II), and wherein a flow amount T (L/min) of those other than the group-III element vapor supplied into the nurturing chamber satisfies following equation (V), $$T=y+t \quad \text{(V)},$$

wherein t (L/min) represents the sum of gas flow amounts flowing into the nurturing chamber from those other than the raw material chamber, and wherein y (L/min) represents the flow amount y (L/min) of a carrier gas supplied into the raw material chamber at the temperature increase step that satisfies the two relational equations (I) and (II).

2. The manufacturing method for a group-III nitride crystal according to claim 1, wherein increasing temperature is executed in a temperature increase process at a temperature that is 500° C. or higher and lower than 1,050° C. before the growth step.

3. The manufacturing method for a group-III nitride crystal according to claim 1, wherein increasing temperature is executed in a mixed atmosphere of an inert gas and the nitrogen element-containing gas.

* * * * *